(12) United States Patent
Dikshit et al.

(10) Patent No.: US 8,624,679 B2
(45) Date of Patent: Jan. 7, 2014

(54) METHOD AND APPARATUS FOR MEMS PHASE LOCKED LOOP

(75) Inventors: Abhinav Kumar Dikshit, Varanasi (IN); Gadam Chetty Deva Phanindra Kumar, Andhra Pradesh (IN); Anjan Kumar Krishnaswamy, Bangalore (IN)

(73) Assignee: Analog Devices, Inc., Norwood, MA (US)

( * ) Notice: Subject to any disclaimer, the term of this patent is extended or adjusted under 35 U.S.C. 154(b) by 230 days.

(21) Appl. No.: 13/086,746

(22) Filed: Apr. 14, 2011

(65) Prior Publication Data

US 2011/0254599 A1    Oct. 20, 2011

Related U.S. Application Data

(60) Provisional application No. 61/324,093, filed on Apr. 14, 2010.

(51) Int. Cl.
    *H03L 7/00* (2006.01)
(52) U.S. Cl.
    USPC .............. 331/18; 331/25; 331/47; 331/107 R; 331/108 B
(58) Field of Classification Search
    USPC ............. 331/25, 47, 107 R, 108 B, 116 R, 18
    See application file for complete search history.

(56) References Cited

U.S. PATENT DOCUMENTS

| | | | | |
|---|---|---|---|---|
| 6,041,642 A  *  | 3/2000 | Duncan | | 73/24.01 |
| 6,094,102 A | 7/2000 | Chang et al. | | 331/17 |
| 6,249,189 B1 * | 6/2001 | Wu et al. | | 331/18 |
| 6,285,219 B1 * | 9/2001 | Pauls | | 327/3 |
| 6,585,338 B2 | 7/2003 | Harris | | 321/4 |
| 7,042,213 B2 | 5/2006 | Greywall | | 324/244 |
| 7,173,495 B1 * | 2/2007 | Kenny et al. | | 331/49 |
| 7,570,125 B2 * | 8/2009 | Ostanin et al. | | 331/158 |
| 2005/0280879 A1 | 12/2005 | Gibson et al. | | 358/474 |
| 2006/0034403 A1 * | 2/2006 | Huang et al. | | 375/354 |
| 2007/0188253 A1 | 8/2007 | Sutardja | | 331/176 |
| 2009/0267837 A1 | 10/2009 | Lin | | 342/387 |

OTHER PUBLICATIONS

Analog Devices, Inc., Fundamentals of Phase Locked Loops (PLLs), Analog Devices, MT-086 Tutorial, 10 pages, 2009.
Abramovitch, Daniel, Phase-Locked Loops: A Control Centric Tutorial, *Proceedings of the American Control Conference*, 15 pages, May 8-10, 2002.
Kester, Walt, Converting Oscillator Phase Noise to Time Jitter, Analog Devices, MT-008 Tutorial, 10 pages, 2009.

\* cited by examiner

*Primary Examiner* — Joseph Chang
*Assistant Examiner* — Jeffrey Shin
(74) *Attorney, Agent, or Firm* — Sunstein Kann Murphy & Timbers LLP (57) ABSTRACT

The proper operation of a phase locked loop is determined by monitoring certain signals within the loop for their phase relationship or duty cycle. If a malfunction of the loop is detected, proper operation may be imposed or restored by resetting a phase-frequency detector, or by flipping the output of the phase-frequency detector.

10 Claims, 7 Drawing Sheets

METHOD AND APPARATUS FOR MEMS PHASE LOCKED LOOP

PRIORITY

This patent application claims priority from provisional U.S. patent application No. 61/324,093, filed Apr. 14, 2010, entitled, "Method and Apparatus for MEMS Phase Locked Loop," and naming Abhinav Kumar Dikshit, Gadam Chetty Deva Phanindra Kumar, and Anjan Kumar Krishnaswamy as inventors [practitioner's file 2906/127], the disclosure of which is incorporated herein, in its entirety, by reference.

TECHNICAL FIELD

The present invention relates to phase locked loops, and more particularly to phase locked loops driving oscillating MEMS structures.

BACKGROUND ART

Some micro-electromechanical systems ("MEMS") operate by driving a movable member into oscillation. For example, in a MEMS gyroscope, a drive signal is applied to a MEMS structure to force the structure into oscillation, preferably at its resonant frequency. The MEMS structure imparts a phase shift on the drive signal. The magnitude of the phase shift is a function of the proximity of the oscillating frequency of the structure to its resonant frequency. A phase locked loop ("PLL") in the drive circuitry processes the phase data to adjust the drive frequency towards the resonant frequency. A PLL in the drive circuitry can, once it achieves phase lock, assist in maintaining the oscillation at the desired frequency.

SUMMARY OF THE EMBODIMENTS

In a first embodiment, there is provided a method of driving an oscillating member. The method includes applying a drive signal to the oscillating member, the drive signal having a drive frequency; providing a first reference signal indicative of the phase shift imparted on the drive signal by the oscillating member; decreasing the drive frequency if the phase shift is less than ninety degrees, and increasing the drive frequency if the phase shift is between ninety and one hundred eighty degrees.

In some embodiments, the method includes providing a second reference signal, the second signal having the same frequency as the drive signal, but leading the drive signal by ninety degrees; and determining the phase shift by determining the phase between the second reference signal and the first reference signal. In some embodiments, determining the phase difference between the second reference signal and the first reference signal includes determining whether an edge of the first reference signal leads or lags a corresponding edge of the second reference signal, wherein the corresponding edge occurs within one quarter of a period of the drive frequency from the edge of the first reference signal.

In some embodiments, decreasing the drive frequency if the phase shift is less than ninety degrees, and increasing the drive frequency if the phase shift is between ninety and one hundred eighty degrees, includes generating a first control signal if the phase shift is less than ninety degrees, and generating a second control signal if the phase shift is greater than ninety degrees.

In another embodiment, there is provided a method of addressing positive feedback in a circuit driving an oscillating member. The method includes: applying a drive signal having a drive frequency to the oscillating member; providing a first reference signal to a phase detector, the first reference signal indicative of the phase shift imparted on the drive signal by the oscillating member; providing a second reference signal to the phase detector, the second signal having the same frequency as the drive signal, but leading the drive signal by ninety degrees; generating a first control signal if a phase detector determines that the first reference signal leads the second reference signal; and resetting the phase detector if the first control signal is active at a falling edge of the second reference signal.

In some embodiments, applying a drive signal includes generating the second reference signal; and producing the drive signal by imposing a phase shift of negative ninety degrees on the second reference signal, such that the second reference signal leads the drive signal by 90 degrees. In some embodiments, providing a second reference signal includes generating the drive signal; and producing the second reference signal by imposing a phase shift of 270 degrees on the reference signal, such that the second reference signal leads the drive signal by 90 degrees.

Some embodiments also include generating a second control signal if a phase detector determines that the first reference signal lags the second reference signal; and resetting the phase detector if the second control signal is active at a falling edge of the second reference signal.

In another embodiment, there is provides a A method of driving an oscillating member using a phase locked loop, which includes applying a drive signal having a drive frequency to the oscillating member; providing a reference signal indicative of the phase shift imparted on the drive signal by the oscillating member; comparing the phase of the drive signal to the reference signal in a phase detector; generating a first control signal if the reference signal lags the drive signal; and determining whether the duty cycle of the first control signal exceeds a predetermined percent; and increasing the frequency of the drive signal if the duty cycle of the first control signal exceeds the predetermined percent.

In some embodiments, the predetermined percent is at least 25 percent, while in other embodiments the predetermined percent is at least 50 percent, and in yet other embodiments, the predetermined percent is at least 75 percent.

In some embodiments, determining whether the duty cycle of the first control signal exceeds a predetermined percent includes determining whether the duty cycle of the first control signal exceeds a predetermined percent for at least a predetermined number of cycles of the drive signal, the predetermined number of cycles of the drive signal being at least two. In some embodiments, the predetermined number of cycles of the drive signal is at least three cycles.

In one embodiment, there is provides a method of driving an oscillating member using a driver, wherein the driver provides a drive signal to the oscillating member, the drive signal having a drive frequency. The method includes determining whether the oscillating member is oscillating above a desired frequency; determining whether the driver is increasing the drive frequency; and resetting the driver if the oscillating member is oscillating above a desired frequency and the driver increasing the drive frequency.

In another embodiment, a method of driving an oscillating member using a driver, wherein the driver provides a drive signal to the oscillating member, the drive signal having a drive frequency, includes determining whether the oscillating member is oscillating below a desired frequency; determining whether the driver is decreasing the drive frequency; and resetting the driver if the oscillating member is oscillating above a desired frequency and the driver decreasing the drive frequency.

In one embodiment, there is provides a circuit for driving an oscillating member. The circuit includes: a variable-frequency oscillator having an oscillator output; an arrival-time detector having a first arrival-time detector input and a second arrival-time detector input, an up output and a down output, and a reset input, the first arrival-time detector input coupled to the oscillator output; a phase shifter having an phase shifter input and a phase shifter output, the phase shifter input coupled to the oscillator output; an oscillating member having a member input and a member output, the member input coupled to the phase shifter output, and the member output coupled to the second arrival-time detector input; an error detector having a first error detector input coupled to the up output of the arrival-time detector, and a second error detector input coupled to the down output of the arrival-time detector, and an error detector output coupled to the reset input of the arrival-time detector.

Yet another embodiment provides a method of driving an oscillating member using a phase locked loop, in which the method includes: applying a drive signal having a drive frequency to the oscillating member; providing a first reference signal to a phase detector, the first reference signal indicative of the phase shift imparted on the drive signal by the oscillating member; providing a second reference signal to the phase detector, the second signal having the same frequency as the drive signal, but leading the drive signal by ninety degrees; generating a first control signal if a phase detector determines that the first reference signal leads the second reference signal, and generating a second control signal if a phase detector determines that the first reference signal lags the second reference signal; and transposing at least one of the first control signal and the second control signal is active at a falling edge of the drive signal.

In one embodiment, applying a drive signal includes generating the second reference signal; and producing the drive signal by imposing a phase shift of negative ninety degrees on the second reference signal, such that the second reference signal leads the drive signal by 90 degrees. In another embodiment, providing a second reference signal includes: generating the drive signal; and producing the second reference signal by imposing a phase shift of 270 degrees on the reference signal, such that the second reference signal leads the drive signal by 90 degrees.

BRIEF DESCRIPTION OF THE DRAWINGS

The foregoing features of embodiments will be more readily understood by reference to the following detailed description, taken with reference to the accompanying drawings, in which.

DETAILED DESCRIPTION OF SPECIFIC EMBODIMENTS

Various embodiments disclosed below provide methods and circuits for detecting a malfunction of a micro-electro-mechanical system ("MEMS"), and for correcting such a malfunction. To that end, a system monitors certain signals within the drive circuitry of the MEMS to determine whether the drive circuitry is malfunctioning. If so, circuits react to correct the malfunction and set the drive circuitry to proper operation.

Figure 1A:
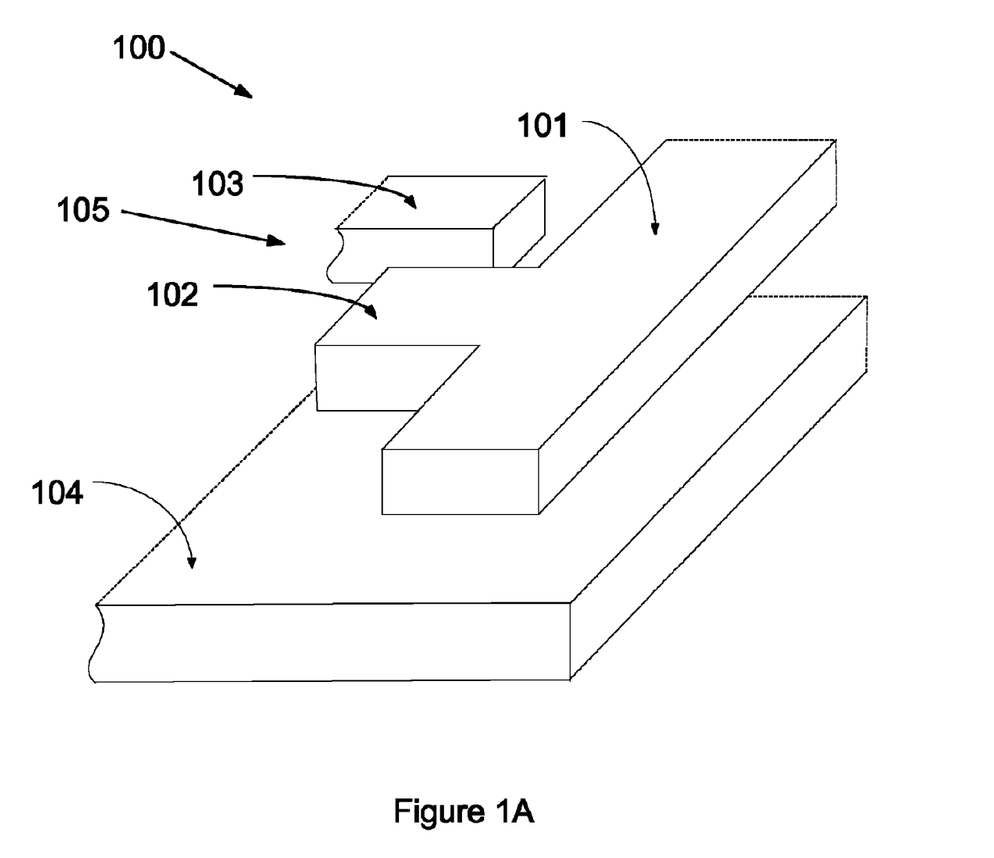
FIG. 1A schematically illustrates a perspective view of a movable MEMS structure.

A system 100 with a movable MEMS structure 101 is schematically illustrated in FIG. 1A. To drive the MEMS structure 101 into oscillation, the MEMS system 100 includes a set of opposing drive fingers 102, 103. One of the fingers is on the movable MEMS structure 101, and the other is on a substrate 104 that supports the moveable MEMS structure 101. As such, the opposing fingers form a variable capacitor that changes capacitance as the movable MEMS structure 101 oscillates with respect to the substrate 104.

One of the fingers is coupled to an oscillating drive signal, and the other is coupled to a ground reference, for example. As the drive signal oscillates, charge flows to and from the finger to which the drive signal is coupled, resulting in a corresponding oscillating electrostatic force on the second finger. The oscillating electrostatic force, in turn, causes to movable MEMS structure 101 to oscillate by alternately drawing the fingers 102, 103 closer together, and then allowing them to pull away from each other.

The flow of charge to the variable capacitor 105 formed by the drive fingers 102, 103 has a phase relationship to the drive signal. The phase shift is a function the oscillating frequency of the structure, and depends on the proximity of the oscillating frequency to the member's resonant frequency.

The phase shift may be detected using a charge amplifier to produce a voltage signal representing the time-varying charge on the variable capacitor. The voltage signal is, in turn, input to a comparator. The comparator's output will, in a sense, be a digital representation of the drive signal, as phase-shifted by the MEMS. Accordingly, in one sense the comparator's output may be described as a signal that indicates (or is indicative of) the phase shift imparted on the drive signal by the oscillating member.

Ideally, the movable MEMS structure 101 will oscillate at the same frequency as the oscillating drive signal, although achieving that frequency of mechanical oscillation may take some time after the oscillating drive signal is initially applied. If the movable MEMS structure 101 oscillates at its resonant frequency, the amplitude of the oscillation will be maximized, which is often desirable in the operation of MEMS systems. Therefore, it is desirable in some applications to achieve and maintain a target oscillation frequency in the movable MEMS structure 101. A phase locked loop in the drive circuitry can help achieve and hold that oscillating frequency.

Figure 1B:
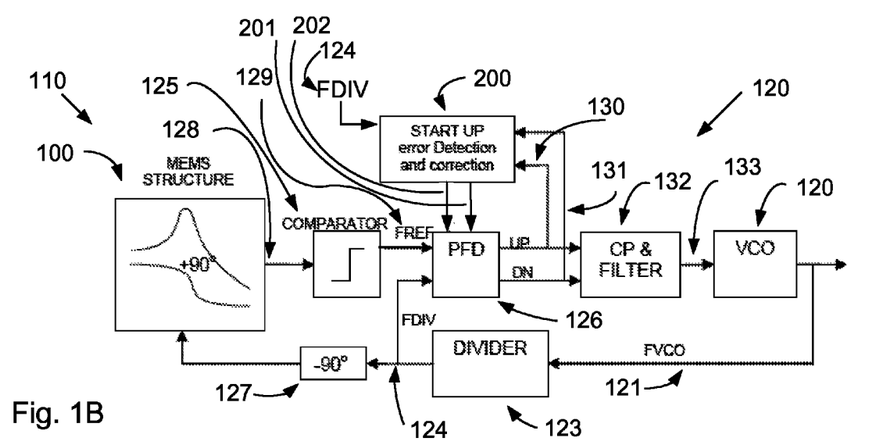
FIG. 1B schematically illustrates an embodiment of a phase locked loop circuit driving an oscillating MEMS structure.

To achieve and maintain the desired oscillating frequency, the embodiment 110 of FIG. 1B uses a phase locked loop ("PLL") 120 in the drive circuitry. The PLL 120 senses and processes the phase shift. In proper operation, the PLL 120 will adjust the frequency of the VCO output signal ("FVCO") 121 (which frequency may be known as the "drive frequency") towards the desired oscillating frequency, which may be the resonant frequency of the movable structure 101. A PLL 120 in the drive circuitry can also assist in maintaining the oscillation frequency at the desired frequency.

The ability of the PLL 120 to achieve phase lock can be a function of several factors, such as start-up conditions, and the Q-factor of the MEMS oscillator. The PLL 120 may malfunction if, for example, the PLL 120 incorrectly interprets the phase information, or if it cannot detect the phase-shifted signal.

In the embodiment of FIG. 1B, a voltage controlled oscillator (VCO) 122 produces a digital clock signal. A divider 123 then divides that signal by 512 to produce a lower-frequency output signal (FDIV) 124 (in other words, in this embodiment the frequency of FDIV is 1/512 of the frequency of FVCO). That output (FDIV) 124 of the divider 123 is supplied to a phase-frequency detector (PFD) 126, and to a phase shifter 127 to shift its phase by negative ninety degrees prior to its application to the MEMS structure 101 as a drive signal. In some embodiments, phase shifter 127 causes a phase locked loop to drive a MEMS at a frequency other than the resonant frequency of the movable member by producing a phase shift of other than negative 90 degrees (i.e., greater or less than negative 90 degrees).

The MEMS structure 101 imparts a phase shift on the drive signal, and the phase-shifted signal 128 is output to a comparator 125. The comparator output (FREF) 129 is supplied to the PFD 126, where it is compared to the FDIV signal 124 from the divider 123. Thus, the comparator output (FREF 129) may be described as a signal that indicates (or is indicative of) the phase shift imparted on the drive signal by the oscillating member.

Figure 6:
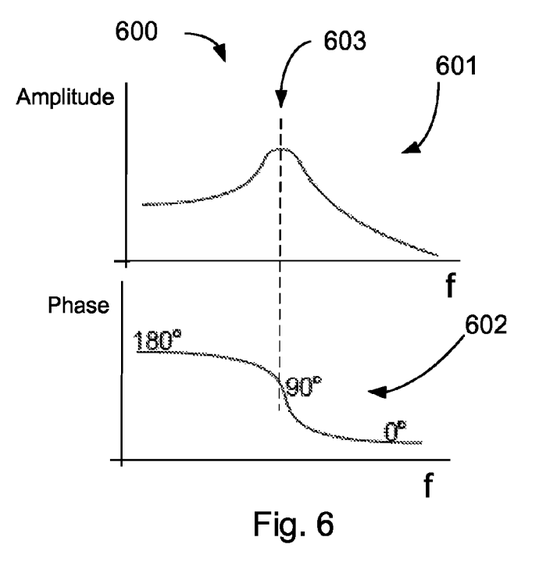
FIG. 6 graphically illustrates the phase shift imparted on the drive signal by a MEMS device at various oscillating frequencies.

At its resonant frequency, the phase imparted by the MEMS structure 101 is ninety degrees, as illustrated by the graphs 600 of FIG. 6, in which curve 601 represents the amplitude of oscillation as a function of frequency, and curve 602 represents the phase shift as a function of the proximity of the oscillation to the resonant frequency of the MEMS structure 101. The dashed line 603 identifies the resonant frequency of the movable MEMS structure 101, and shows a corresponding phase shift of ninety degrees.

The graphs 600 of FIG. 6 also show that, if the movable MEMS structure 101 is oscillating at a frequency below its resonant frequency, then the phase shift imparted on the drive signal will be greater than ninety degrees, and perhaps as high as 180 degrees. Similarly, if the movable MEMS structure 101 is oscillating at a frequency above its resonant frequency, then the phase shift imparted on the drive signal will be less than ninety degrees, and perhaps as low as zero degrees. In other words, the greater the difference between the oscillating frequency and the resonant frequency, the greater the phase shift.

As such, when the MEMS structure 101 is at its resonant frequency, the comparator output (FREF) 129 should be in phase with the first divider output (FDIV 124). In other words, at its resonant frequency, the FREF 129 signal 129 should arrive at the PFD 126 simultaneously with the FDIV signal 124.

Figure 1C:
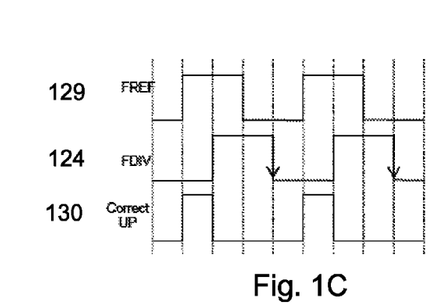
FIGS. 1C, 1D, 1E, and 1F schematically illustrate timing diagrams of certain signals within the phase locked loop of FIG. 1B.
Figure 1D:
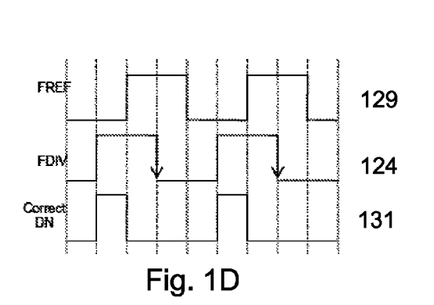

If those signals are not in phase, however, they will have a different arrival time at the PFD 126. Such a difference in arrival time (e.g., phase) between FREF 129 and FDIV 124 indicate that the MEMS structure 101 is not oscillating at its resonant frequency, causing the PFD 126 to output an appropriate signal ("UP" as illustrated in FIG. 1C, or "DN" as illustrated in FIG. 1D) to the a charge pump ("CP") and filter 132, which translate the UP and DN signals to a VCO control signal 133, so as to direct the VCO 122 to change frequency in the direction of the resonant frequency of the MEMS structure 101. As such, the PLL 120 eventually adjusts the frequency of the drive signal until it locks at the resonant frequency of the MEMS structure 101. The PFD 126 may also be known as an arrival-time detector, because it responds to differences in the arrival time of the FDIV 124 and FREF 129 signals.

FIG. 1C schematically illustrates the signals FREF 129 and FDIV 124 for the case in which MEMS structure 101 is oscillating at less than its resonant frequency. In this case, the phase shift is greater than ninety degrees, such that FDIV 124 lags FREF 129, and a rising edge of FREF 129 will reach the PFD 126 before the a rising edge of FDIV 124. Specifically, in this illustration, the phase shift imparted by the MEMS structure 101 is 180 degrees, so that FREF 129 leads FDIV 124 by ninety degrees.

Figure 3:
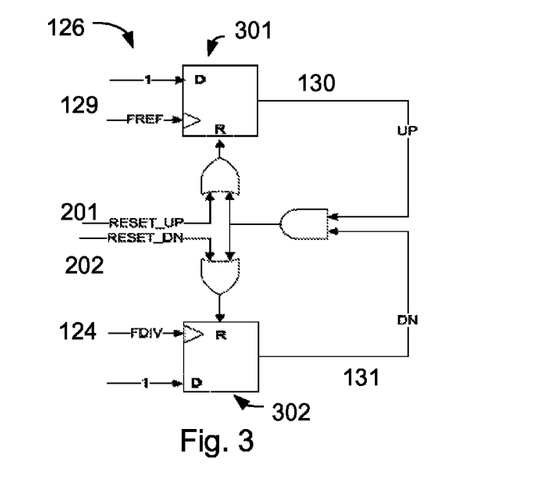
FIG. 3 schematically illustrates an embodiment of the PFD 126 circuit of FIG. 1B.

The PFD 126, which may be as illustrated in FIG. 3, will process the signals and set the "UP" signal 130 to a logic high state. Specifically, the rising edge of FREF 129 causes the D-flop 301 to output the UP signal 130. The UP signal 130, in turn, causes the VCO 122 to increase the drive frequency. Eventually, the rising edge of FDIV 124 causes D-flop 302 to output the DN signal, which resets both of the D-flops 301 and 302.

As the oscillating frequency of the MEMS structure 101 increases, the rising edges of FDIV 124 and FREF 129 will arrive at the PFD 126 closer in time, until they eventually arrive simultaneously, at which point the MEMS structure 101 will oscillate at its resonant frequency.

Similarly, FIG. 1D illustrates the signals FREF 129 and FDIV 124 for the case in which MEMS structure 101 is oscillating at greater than its resonant frequency. In this case, the phase shift imparted on FDIV 124 by the MEMS is less than ninety degrees, and a rising edge of FREF 129 will reach the PFD 126 after the a rising edge of FDIV 124. Specifically, in this illustration the phase shift imparted by the MEMS structure is zero degrees, so that FREF 129 lags FDIV 124 by ninety degrees.

The PFD 126 will process the signals and set the "DN" signal 131 to a logic high state. The DN signal 131, in turn, causes the VCO 122 to decrease the drive frequency. As the oscillating frequency of the MEMS structure decreases, the rising edges of FDIV 124 and FREF 129 will arrive at the PFD 126 closer in time, until they eventually arrive simultaneously, at which point the MEMS structure 101 will oscillate at its resonant frequency.

A problem may arise, however, if the PFD 126 misinterprets the arrival of the rising edges of FDIV 124 and FREF 129. For example, if the MEMS structure 101 is oscillating at less than its resonant frequency, then FREF 129 will lead FDIV 124, as illustrated in FIG. 1C and discussed above. In some situations (e.g., a start-up glitch), the PFD 126 may malfunction and process the signals as if FREF 129 lags FDIV 124 by 270 degrees (as opposed to leading by 90 degrees). For example, on power-up, FDIV 124 may be the first signal to arrive at the PFD 126, causing the PFD 126 to react as if the oscillating frequency of the MEMS structure is too high.

Figure 1E:
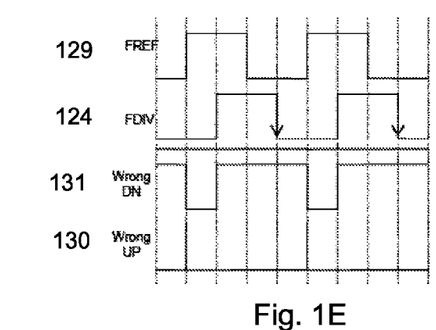

Such a situation is illustrated in FIG. 1E, in which the oscillating frequency of the MEMS structure is too low, but PFD 126 has (wrongly) asserted the DN signal. In response, the PLL will adjust the drive frequency even lower, resulting in positive feedback to cause the MEMS structure to oscillate slower still.

Figure 1F:
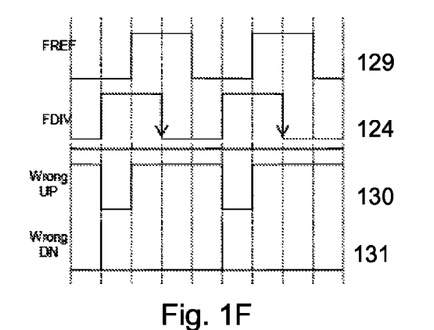

As similar problem may arise if the MEMS structure is oscillating a greater than its resonant frequency (e.g., FIG. 1D as discussed above), and yet the PFD 126 processes the signals as if FREF 129 leads FDIV 124 by 270 degrees (as opposed to lagging by ninety degrees). In that case, the PFD 126 will react as if the oscillating frequency of the MEMS structure is too low. This situation is illustrated in FIG. 1F, in which the PFD 126 has (wrongly) asserted the UP signal 130. In response, the PLL will adjust the drive frequency even higher, resulting in positive feedback to cause the MEMS structure to oscillate faster still.

Such problems may be addressed by (a) determining whether the loop is providing feedback so as to adjust the drive frequency in the wrong direction (which may be known as positive feedback), and then (b) taking or applying corrective action. For example, if the MEMS structure 101 is oscillating below its desired (resonant) frequency, and if the loop 120 is adjusting the frequency lower, then the action of the loop 120 may be reset or reversed. Similarly, if the MEMS structure 101 is oscillating above its desired (resonant) frequency, and if the loop 120 is adjusting the frequency higher, then the action of the loop may be reset or reversed.

Such malfunctions may be characterized in that PFD 126 is outputting a signal to change the frequency of the VCO 122 during the falling edge of FDIV 124. For example, in FIG. 1E, the (erroneous) DN signal 131 is logic high at the falling edge of FDIV 124, while in FIG. 1F, the (erroneous) UP signal 130 is logic high at the falling edge of FDIV 124. Therefore, one way to recognize a malfunction is to determine whether the UP or DN signal is logic high at a falling edge of FDIV 124.

Figure 2:
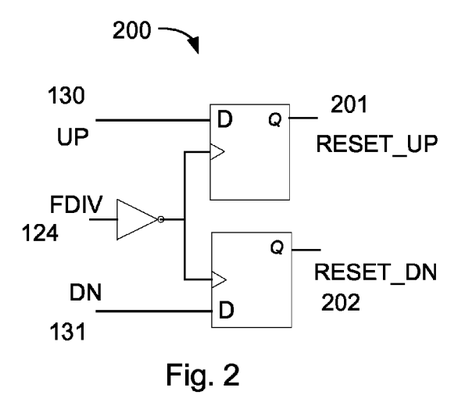
FIG. 2 schematically illustrates an embodiment of the start up and error detection and correction circuit of FIG. 1B.
Figure 4:
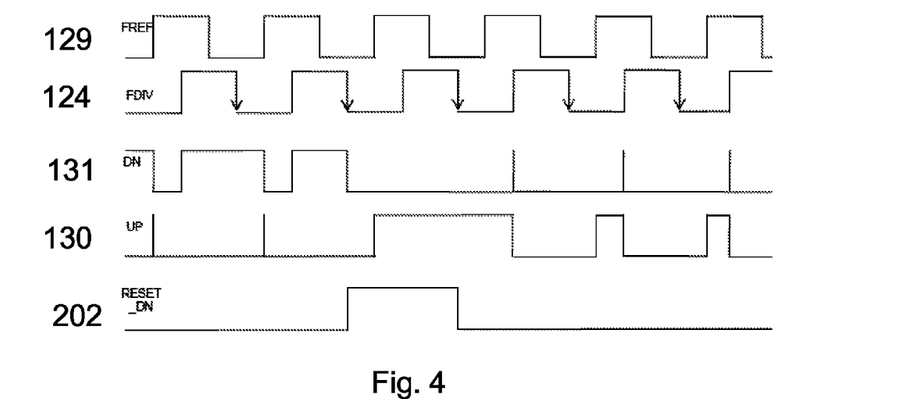
FIG. 4 is a timing diagram of certain signals within the phase locked loop of FIG. 1B.

FIG. 2 schematically illustrates an embodiment of a start-up error detection and correction circuit 200 (which may be known as an "error detector") that determines whether the UP 130 or DN 131 signal is logic high at a falling edge of FDIV 124. If the DN signal 131 is logic high at a falling edge of FDIV 124, then the circuit sets the RESET_DN signal 202 to logic high, as illustrated in FIG. 4. The RESET_DN signal 202, in turn, resets the D-flop 302 in the PFD 126 (see FIG. 3). Thereafter, a rising edge of the FREF 129 signal will arrive at the PFD 126 before the next rising edge of FDIV 124, and the PFD 126 will react appropriately by asserting the UP signal 130, as in FIG. 1C, discussed above.

Similarly, if the UP signal 130 is logic high at a falling edge of FDIV 124, the start-up error detection and correction circuit 200 may set the RESET_UP signal 201 to logic high (not illustrated). The RESET_UP signal 201, in turn, resets the D-flop 301 in the PFD 126. Thereafter, a rising edge of the FDIV 124 signal will arrive at the PFD 126 before the next rising edge of FREF 129, and the PFD 126 will react appropriately by asserting the DN signal 131, as in FIG. 1D, discussed above.

In some embodiments, the start-up error detection and correction circuit may be configured to detect the erroneous condition (malfunction) on two or more falling edges of FDIV 124 prior to asserting a RESET_UP signal 201 or RESET_DN signal 202. An algorithm 500 for processing signals to identify erroneous DN signal 131 may be as illustrated in the flow chart in FIG. 5 and described below. A similar process could be used in the detection of an erroneous UP signal 130.

Figure 5:
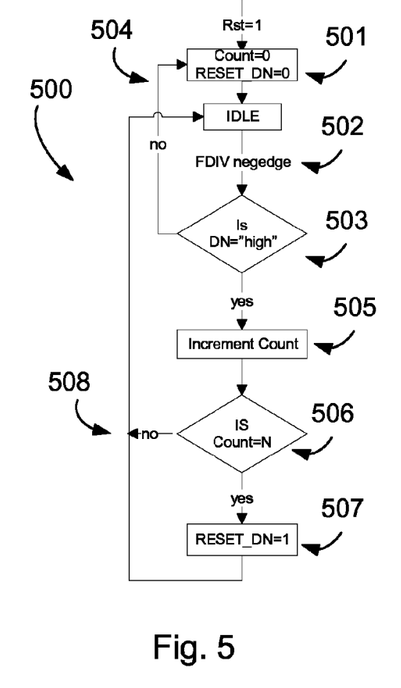
FIG. 5 schematically illustrates an algorithm for assessing a signal within the phase locked loop.

The algorithm 500 of FIG. 5 detects an erroneous condition (malfunction) on two or more (in any event, a predetermined number, "N") falling edges of FDIV 124 by counting the number of times that the DN signal 131 is logic high (step 503) at a falling edge of FDIV 124 (step 502). At the beginning of the process, the RESET_DN signal 202 is set to logic zero, and a counter or variable (Count) is set to zero (step 501). When the DN signal 131 is logic high (step 503) at a falling edge of FDIV 124 (step 502), then the Count variable is incremented (step 505). Otherwise the process resets the process (504). Each time Count is incremented (step 505), the method 500 determines whether Count has reached the predetermined number "N" (step 506). If so, the RESET_DN signal 202 is set to logic high and the PFD 126 is reset as described above. Otherwise, the method loops back to await the next falling edge of FDIV (508).

The method described above in connection with the circuits of FIG. 1B may be implemented by a variety of circuit designs, or by using a microprocessor programmed with code to monitor and react to the signals of the PLL 120. For example, an alternate embodiments may shift the FDIV 124 signal by +90 degrees (or −270 degrees), instead of shifting the drive signal by −90 degrees as in FIG. 1B, to produce a 90 phase difference between those signals.

Another problem may arise if the phase-shifted drive signal output from the MEMS structure is not detectable, for example, by the comparator 125. This may potentially occur, for example, when the MEMS structure 101 is just beginning to oscillate, because the signal output 128 may have an amplitude below the threshold of the comparator 125. Alternately, if the MEMS structure 101 has a high Q (quality factor) and is oscillating above or below its resonant frequency, the output signal 128 may have an amplitude below the threshold of the comparator 125.

In such situations, the comparator 125 may fail to produce the FREF signal 129. In that case, the FDIV signal 124 will eventually arrive at the PFD 126, and the PFD 126 will react to the FDIV signal 124 as it would in the situation where FREF 129 lags FDIV 124 (i.e., as if the oscillating frequency of the mass is greater than the desired frequency) and the PLL 120 will act to lower the drive frequency. While this would be acceptable if the oscillation frequency were, in fact, too high, it is unacceptable positive feedback when the oscillation frequency is below the desired frequency.

This malfunction is characterized in that the DN signal 131 from the PFD 126 will have a duty cycle that is greater than 25 percent or more. Indeed, in embodiments described above (e.g., FIG. 1D), the DN signal 131 should preferably have a duty cycle of between zero and 25 percent (e.g., corresponding to the phase difference between FREF 129 and FDIV 124, which could be between zero and 90 degrees). Thus, corrective action may be indicated based on the duty cycle of the DN signal 131.

Figure 7A:
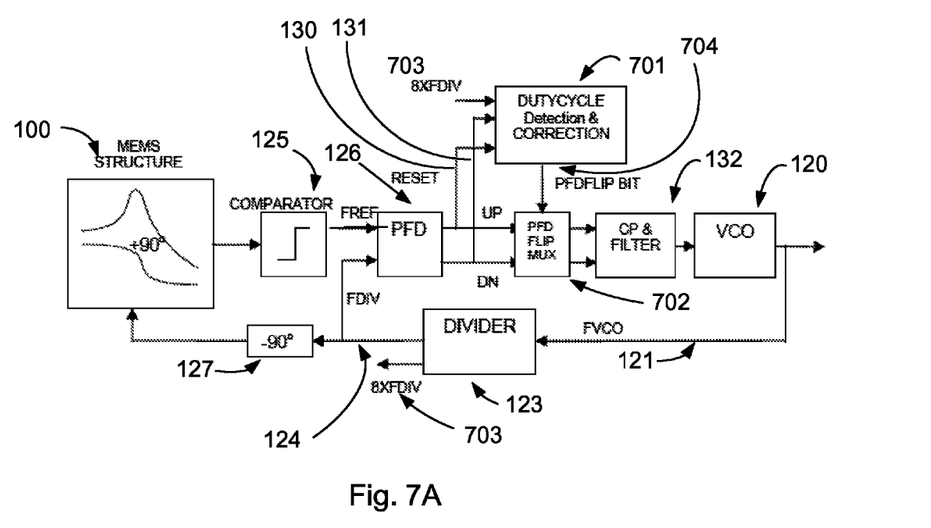
FIGS. 7A-7C schematically illustrate a phase locked loop circuit driving an oscillating MEMS structure according to an alternate embodiment.

FIG. 7A schematically illustrates a PLL circuit 700 with a duty cycle detection and correction apparatus 701. The duty cycle detection and correction apparatus 701 may be a circuit, such as a digital circuit, or a microprocessor programmed to implement a process.

Detection of the duty cycle of the DN signal 131 may be performed in a variety of ways. In the embodiment of FIG. 7A, the clock divider creates a signal (8×FDIV) 703 that is eight times the frequency of the FDIV signal 124. Other embodiments may use different multiples of FDIV 124.

The duty cycle detection and correction apparatus 701 samples the DN signal 131 once for each cycle of the 8×FDIV signal 703, and counts (using a digital counter) the number logic high samples. If the DN signal 131 is logic high for more than a predetermined number of 8×FDIV cycles, the loop 700 has malfunctioned. For example, if the DN signal 131 is logic high for as many as three or four out of any eight 8×FDIV cycles, then the duty cycle of DN 131 is greater than 25 percent (a 25 percent duty cycle would be two out of eight cycles), thus indicating a malfunction.

Figure 7B:
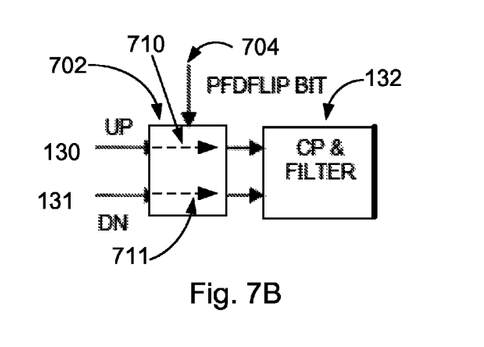
Figure 7C:
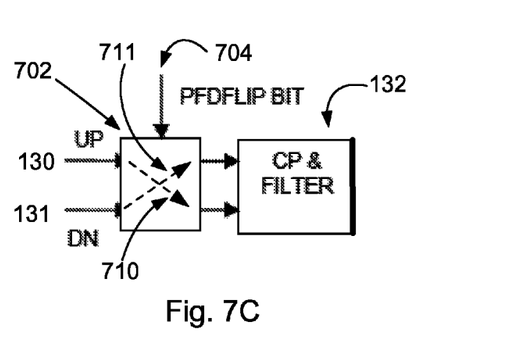

If an erroneous duty cycle is detected, the UP 130 and DN 131 signals in the loop 700 may be transposed (or flipped or swapped). For example, switches, multiplexers or logic circuits could couple the DN signal to the UP line, with the result that the loop will then drive the frequency higher. In the embodiment of FIG. 7A, the duty cycle detection and correction apparatus 701 asserts a signal (PFD FLIP BIT) 704 to control a PFD FLIP MUX 702 for this purpose. Signal connections within the PFD Flip Mux 702 are schematically illustrated by the dashed arrows (710 and 711) in FIG. 7B (default connection) and FIG. 7C (flipped connection). If the PFD Flip Mux 702 is in the state illustrated by FIG. 7B when a malfunction is detected, the PFD FLIP BIT 704 will cause the PFD Flip Mux 702 to change state, to couple the signals as illustrated in FIG. 7C. Eventually, when the system 700 is at or near phase lock, or if the duty cycle falls to 25 percent for example, the signals may optionally be restored to their original connections.

An embodiment of a method of driving an oscillating member using a phase locked loop may be described as follows:

applying a drive signal having a drive frequency to the oscillating member;

providing a reference signal [FREF] indicative of the phase shift imparted on the drive signal by the oscillating member;

comparing the phase of the drive signal (or a second reference signal having the same frequency as the drive signal, but leading the drive signal by 90 degrees) to the reference signal in a phase detector;

generating a first control signal [DN] if the first reference signal lags the drive signal [apparently indicating that the oscillating member is oscillating too fast]; and determining whether the duty cycle of the first control signal exceeds a predetermined percent; and increasing the frequency of the drive signal if the duty cycle of the first control signal [DN] exceeds the predetermined percent.

In some embodiments, the duty cycle detection and correction apparatus may detect the erroneous condition based on an assessment of two or more cycles. An algorithm for processing for an erroneous DN signal may be as illustrated in the flow chart 800 in FIG. 8, and may be implemented in hardware (e.g., digital circuits) or in software (e.g., in a programmed microprocessor, or in software on a computer readable medium such as a CD-ROM).

Figure 8:
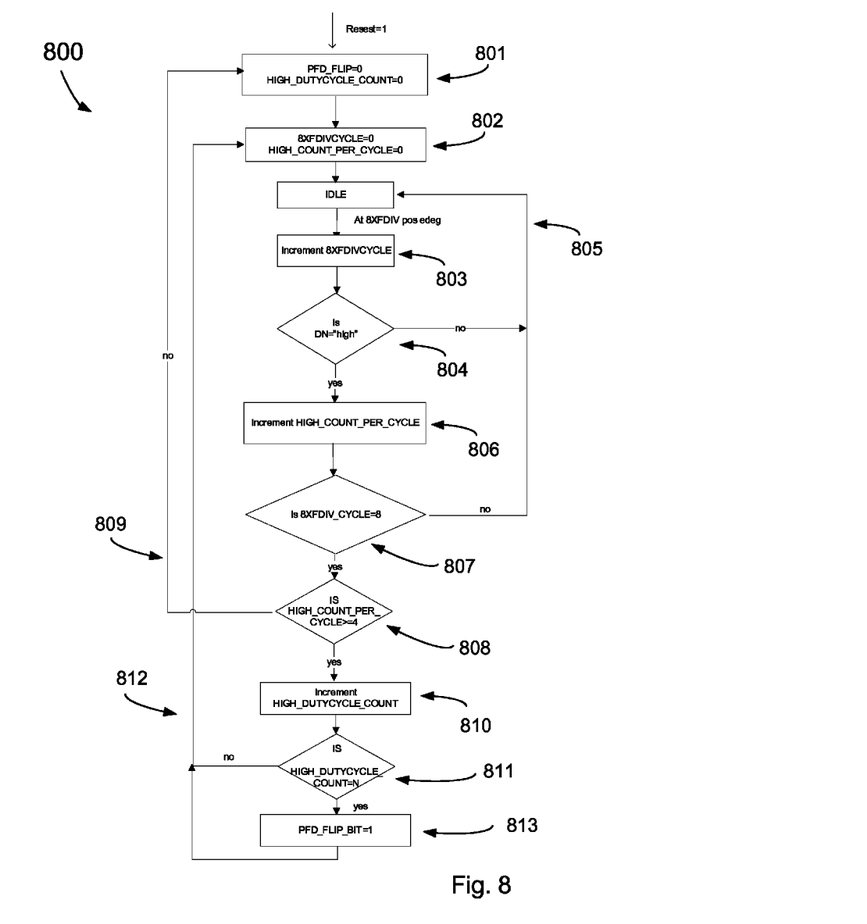
FIG. 8 schematically illustrates an algorithm for assessing a signal within the phase locked loop.

In the embodiment of such a process 800 illustrated by FIG. 8, an erroneous duty cycle is determined as one in which the DN signal 131 is logic high for at least four out of eight cycles of 8×FDIV 703 (i.e., at least a fifty percent duty cycle). The PFD_FLIP_BIT 704 is set to logic high (i.e., "1") after "N" such instances have been detected. In some embodiments, the number of cycles ("N") could be range from 16 to 64, but could be as low as one (i.e., a single instance of erroneous duty cycle) or greater than 64, as determined by the parameters of the system in which the loop operates. In some embodiments, an erroneous duty cycle is determined as one in which the DN signal 131 is logic high for at least three out of eight cycles of 8×FDIV 703 (37.5 percent duty cycle) or indeed for any number of cycles greater than two out of eight or otherwise greater than a 25 percent duty cycle. In general, an erroneous duty cycle may be determined as one in which the DN signal is logic high for at least a number of cycles equal to 8×FDIV 703 divided by four.

Returning to the process 800 of FIG. 8, several variables (HIGH_DUTY_CYCLE_COUNT; 8×FDIVCYCLE; and HIGH_COUNT_PER_CYCLE) are set to zero, and control signal PDF_FLIP (or PDF_FLIP_BIT) 704 is set to zero at steps 801 and 802. With PDF_FLIP (or PDF_FLIP_BIT) 704 set to zero, the PFD Flip Mux 702 couples the UP signal 130 and the DN signal 131 to the charge pump 132 as shown in FIG. 7B.

At a rising edge of 8×FDIV 703, the process 800 increments variable 8×DIVCYCLE (step 803), and determines whether signal DN 131 is logic high (step 804). If not, the process 800 loops back to await the next rising edge of 8×FDIV 703. Otherwise, the process 800 increments the variable HIGH_COUNT_PER_CYCLE (STEP 806), and determines whether 8×DIVCYCLE has a value of 8 (in other words, the process determines whether it has processed eight edges of the 8×FDIV signal) (step 807).

If the process 800 has not yet processed eight edges of the 8×FDIV signal, then the process loops back to await the next rising edge of 8×FDIV 703 (805).

Otherwise (if the process 800 has processed eight edges of the 8×FDIV signal), the process 800 determines whether the variable HIGH_COUNT_PER_CYCLE is equal to or greater than four (step 808) (in other words, is the duty cycle of DN 131 equal to or greater than fifty percent). If not, then the loop is not in error (there is no malfunction) and so the process loops back to reset the variables (809). Otherwise, the process 800 increments the variable HIGH_DUTYCYCLE_COUNT (step 810) to indicate that an instance of an erroneous DN signal 131 has been detected.

The process then determines whether a predetermined number (N) of such instances have been detected (step 811). If not, then the process loops back (812) and resets the 8×FDIVCYCLE variable and the HIGH_DUTYCYCLE_COUNT variable (step 802). If so (i.e., if a number "N" instances of an erroneous DN signal 131 have been detected), then the process 800 sets the PDF_FLIP_BIT 704) signal to logic high, so as to flip the coupling of the UP signal 130 and the DN signal 131 to the charge pump 132, as discussed above. Specifically, with PDF_FLIP (or PDF_FLIP_BIT) 704 set to one, the PFD Flip Mux 702 couples the UP signal 130 and the DN signal 131 to the charge pump 132 as shown in FIG. 7C.

Flipping (or transposing) the UP signal 130 and the DN signal 131 in this way effectively reverses the operation of the charge pump, so as to cause the VCO 120 to increase the frequency of FVCO 121 when the DN signal 131 would otherwise cause a reduction in that frequency, and to decrease the frequency of FVCO 121 when the UP signal 130 would otherwise cause in increase in that frequency.

The transposition of the UP 130 and DN 131 signals in the loop 700 may also address a situation in which the FREF signal 129 is present, but the loop 700 has misinterpreted the phase relationship between FREF 129 and FDIV 124, as shown for example in FIG. 1E and FIG. 1F. In other words, if a malfunction illustrated by either of FIG. 1E or FIG. 1F occur, the malfunction may be addressed by the transposition of the UP 130 and DN 131 signals in the loop 700.

Figure 9A:
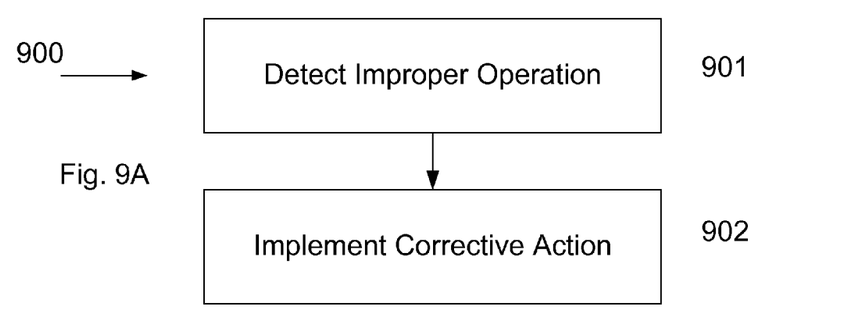
FIGS. 9A, 9B and 9C are flow charts illustrating functions of various embodiments.
Figure 9B:
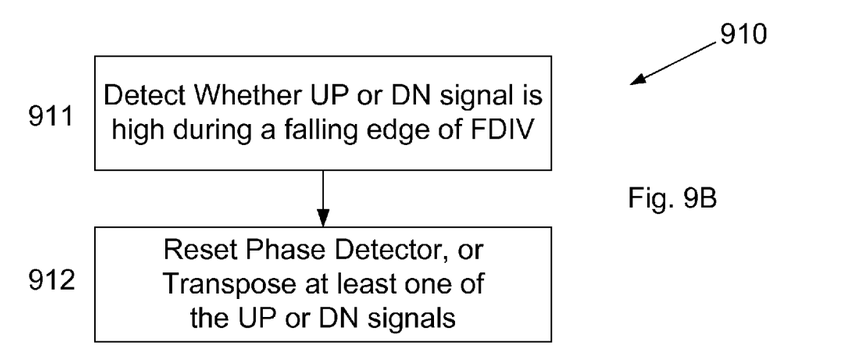
Figure 9C:
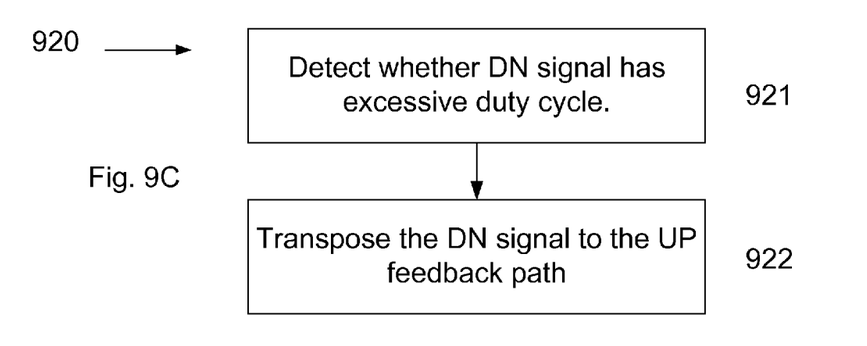

Through detection of a malfunctioning loop, the various embodiments may assist in adjusting the drive frequency of an oscillating mass to a desired frequency. A generalized flow chart 900 is presented in FIG. 9A, and involves detecting a malfunction (step 901), and taking corrective action (step 902) as necessary. For example, if the loop 700 detects that the UP 130 or DN 131 signal is high at a falling edge of FDIV 124 (step 911), then the phase detector (or PFD 126) may be reset, or the UP and/or DN signals may be transposed (step 912) (FIG. 9B), as discussed above. Alternately, if the loop 700 detects that the DN signal 131 has an excessive duty cycle (e.g., greater than 25 percent) (step 921) then the DN signal 131 may be transposed (e.g., coupled to the UP signal 130 line) (step 922) (FIG. 9C).

Various embodiments of the invention may be implemented at least in part in any conventional computer programming language. For example, some embodiments may be implemented in a procedural programming language (e.g., "C"), or in an object oriented programming language (e.g., "C++"). Other embodiments of the invention may be implemented as preprogrammed hardware elements (e.g., application specific integrated circuits, FPGAs, and digital signal processors), or other related components.

In an alternative embodiment, the disclosed apparatus and methods may be implemented as a computer program product for use with a computer system. Such implementation may include a series of computer instructions fixed (i.e., non-transient) either on a tangible medium, such as a computer readable medium (e.g., a diskette, CD-ROM, ROM, memory card, or fixed disk). The series of computer instructions can embody all or part of the functionality previously described herein with respect to the system.

Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies.

Among other ways, such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). Of course, some embodiments of the invention may be implemented as a combination of both software (e.g., a computer program product) and hardware. Still other embodiments of the invention are implemented as entirely hardware, or entirely software.

The embodiments of the invention described above are intended to be merely exemplary; numerous variations and modifications will be apparent to those skilled in the art. For example, circuits could be designed to operate on signals of inverted polarity from those shown in the embodiment described herein, or from or on either rising or falling edges of discrete signals. All such variations and modifications are intended to be within the scope of the present invention as defined in any appended claims.

What is claimed is:

1. A method of driving an oscillating member using a phase locked loop, comprising:
    applying a drive signal having a drive frequency to the oscillating member;
    providing a reference signal indicative of the phase shift imparted on the drive signal by the oscillating member;
    comparing the phase of the drive signal to the reference signal in a phase detector;
    generating a first control signal if the reference signal lags the drive signal; and
    determining whether the duty cycle of the first control signal exceeds a predetermined percent; and
    increasing the frequency of the drive signal if the duty cycle of the first control signal exceeds the predetermined percent.

2. The method of claim 1, wherein the predetermined percent is at least 25 percent.

3. The method of claim 1, wherein the predetermined percent is at least 50 percent.

4. The method of claim 1, wherein the predetermined percent is at least 75 percent.

5. The method of claim 1 wherein determining whether the duty cycle of the first control signal exceeds a predetermined percent comprises determining whether the duty cycle of the first control signal exceeds a predetermined percent for at least a predetermined number of cycles of the drive signal, the predetermined number of cycles of the drive signal being at least two.

6. The method of claim 5 wherein the predetermined number of cycles of the drive signal is at least three cycles.

7. A circuit for driving an oscillating member, comprising:
    a variable-frequency oscillator having an oscillator output;
    an arrival-time detector having a first arrival-time detector input and a second arrival-time detector input, an up output and a down output, and a reset input, the first arrival-time detector input coupled to the oscillator output;
    a phase shifter having an phase shifter input and a phase shifter output, the phase shifter input coupled to the oscillator output;
    an oscillating member having a member input and a member output, the member input coupled to the phase shifter output, and the member output coupled to the second arrival-time detector input;
    an error detector configured to determine whether the up output or down output is high at a falling edge of the oscillator output, the error detector having a first error detector input coupled to the up output of the arrival-time detector, and a second error detector input coupled to the down output of the arrival-time detector, and an error detector output coupled to the reset input of the arrival-time detector.

8. A method of driving an oscillating member using a phase locked loop, the method comprising:
    applying a drive signal having a drive frequency to the oscillating member;
    providing a first reference signal to a phase detector, the first reference signal indicative of the phase shift imparted on the drive signal by the oscillating member;
    providing a second reference signal to the phase detector, the second signal having the same frequency as the drive signal, but leading the drive signal by ninety degrees;
    generating a first control signal if a phase detector determines that the first reference signal leads the second reference signal, and generating a second control signal if a phase detector determines that the first reference signal lags the second reference signal; and
    transposing at least one of the first control signal and the second control signal is active at a falling edge of the drive signal.

9. A method of driving an oscillating member using a phase locked loop according to claim 8, wherein applying a drive signal comprises:
    generating the second reference signal; and
    producing the drive signal by imposing a phase shift of negative ninety degrees on the second reference signal, such that the second reference signal leads the drive signal by 90 degrees.

10. A method of driving an oscillating member using a phase locked loop according to claim 8, wherein providing a second reference signal comprises:
    generating the drive signal; and
    producing the second reference signal by imposing a phase shift of 270 degrees on the reference signal, such that the second reference signal leads the drive signal by 90 degrees.

* * * * *